United States Patent
Niederreiter et al.

(10) Patent No.: US 6,222,748 B1
(45) Date of Patent: Apr. 24, 2001

(54) CIRCUIT FOR DETERMINING THE OUTPUT POWER OF SWITCHED-MODE POWER SUPPLY

(75) Inventors: Hans Niederreiter, Mühldorf; Peter Preller, München, both of (DE)

(73) Assignee: Infineon Technologies Aktiengesellschaft, München (DE)

( * ) Notice: Subject to any disclaimer, the term of this patent is extended or adjusted under 35 U.S.C. 154(b) by 0 days.

(21) Appl. No.: 09/508,783

(22) Filed: Mar. 16, 2000

(30) Foreign Application Priority Data

Sep. 17, 1997 (DE) .............................. 197 40 932

(51) Int. Cl.⁷ .................................................. H02M 3/24
(52) U.S. Cl. .............................. 363/97; 363/131
(58) Field of Search ................... 323/288, 284, 323/282, 223, 233, 370, 901; 363/97, 131

(56) References Cited

U.S. PATENT DOCUMENTS

| | | | |
|---|---|---|---|
| 3,629,677 | * 12/1971 | Means | 318/141 |
| 4,338,554 | * 7/1982 | Fukushima et al. | 388/821 |
| 4,783,621 | * 11/1988 | Drefahl | 327/31 |
| 4,996,638 | 2/1991 | Orr . | |
| 5,719,575 | * 2/1998 | Hashimoto | 341/144 |

FOREIGN PATENT DOCUMENTS

| | | |
|---|---|---|
| 25 27 392 B2 | 12/1977 | (DE) . |
| 24 08 780 B2 | 6/1978 | (DE) . |
| 31 29 021 A1 | 2/1983 | (DE) . |
| 38 38 430 A1 | 5/1990 | (DE) . |
| 42 12 472 A1 | 10/1993 | (DE) . |
| 0 744 818 A1 | 11/1996 | (EP) . |

OTHER PUBLICATIONS

JP–63299778 Dec. 1988, abstract only, Katsumi.

* cited by examiner

*Primary Examiner*—Shawn Riley
(74) *Attorney, Agent, or Firm*—Schiff Hardin & Waite

(57) ABSTRACT

A circuit arrangement is provided that is suitable for determining the output power of switched-mode power supplies. A charge capacitor is charged with a constant current for the duration of the discharging time of a transformer. The voltage across the charge capacitor is integrated by a downstream integration element. The output voltage of the integration element is proportional to the mean power of the switched-mode power supply. The inventive circuit arrangement takes into consideration that the charging and discharging times of the transformer can be different for different switching frequencies of the switched-mode power supply, even when the power output of the switched-mode power supply is the same.

4 Claims, 2 Drawing Sheets

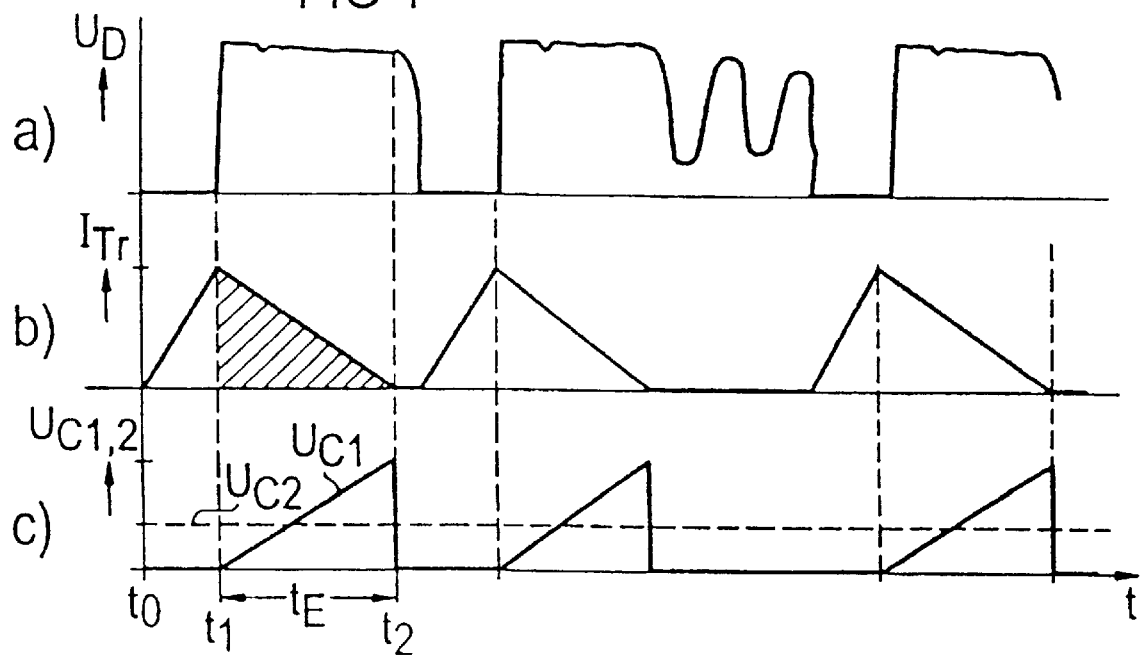
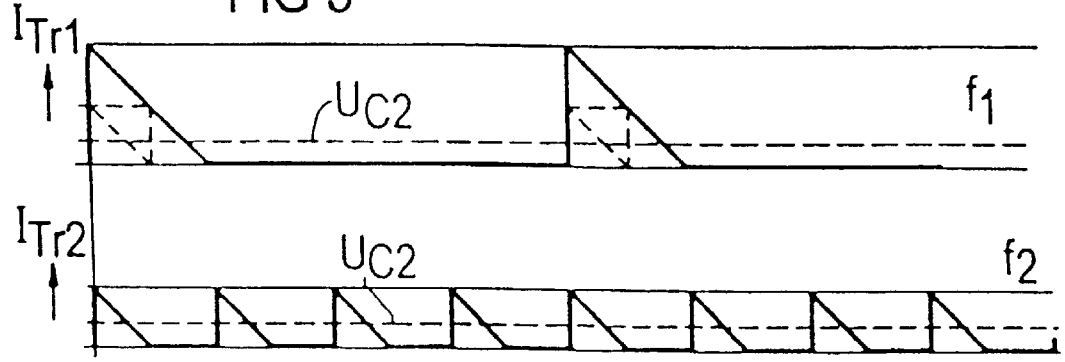

CIRCUIT FOR DETERMINING THE OUTPUT POWER OF SWITCHED-MODE POWER SUPPLY

BACKGROUND OF THE INVENTION

1. Field of the Invention

A circuit arrangement is provided for determining the output power of switched-mode power supplies so that the output power can be determined independent of the frequency and the input voltage.

2. Description of the Related Art

Switched-mode power supplies are characterized by the fact that they deliver a constantly corrected d.c. voltage that is optimally independent of the load. The power output can encompass a broad range. For example, for television devices, the output power range of a switched-mode power supply can range from 5 W to 150 W. For a lower delivered power, a low switching frequency is often set in order to minimize switching losses, or circuit components of the television device are switched in or out. To minimize these losses, the instantaneous power of the switched-mode power supply must be measured at the primary side and appropriately conditioned for controlling the frequency or controlling circuit components. A simple way to determine the power is to measure the primary current in the switching transistor using a measuring resistor. The power is proportional to the square of the current. Since the level of this current also depends heavily on the frequency and the input voltage, this manner of power determination is highly inaccurate.

German Patent Document DE 3 129 021 A1 teaches a circuit arrangement for measuring the through power in d.c. transformers, however, this arrangement is only suitable for transformers that are timed with a constant frequency.

SUMMARY OF THE INVENTION

It is the object of the present invention to set forth a circuit arrangement with which it is possible to determine a measure of the output power of a switched-mode power supply in a simple fashion.

This object is inventively achieved using a circuit arrangement for determining a measure of the output power of a switched-mode power supply, comprising a field effect transistor, a transformer having a primary side supplied with energy via the field effect transistor, the transformer delivering the energy to a secondary side of the transformer during a discharging time period, an integration element a constant current source; an energy storage element being charged with a current by the constant current source during a period in which a drain voltage of the field effect transistor exceeds a specific threshold, and is discharged in a remaining time via a switch, and the integration element being connected to the energy storage element, the integration element integrating a voltage across the energy storage element and feeds it to an output as a measure of output power of the switched-mode power supply.

The inventive circuit arrangement has the advantage that a measure of the power output of a switched-mode power supply can be determined with this arrangement independent of the frequency and the input voltage. Furthermore, the small wiring expenditure of the circuit arrangement is also advantageous.

The circuit arrangement delivers a voltage that is proportional to the power output of a switched-mode power supply. This voltage can be given to one or more comparators, which serve to switch based on certain parameter values for a desired function (e.g., the frequency) in a simple manner.

The energy storage element of the inventive circuit arrangement is preferably realized as a capacitor. The integration element integrates the voltage that is present at a terminal of the energy storage element. It preferably consists of an RC element. Its time characteristic can be adjusted via the magnitude of the resistance and the capacitance of the RC element.

The inventive circuit arrangement for power measurement can be applied in multiple ways. It is preferably used when the frequency is to be switched over in a power-dependent manner and with only slight hysteresis, such as when the power is measured in standby burst mode. A further application for the inventive circuit arrangement is in what is known as temporary high load mode. In this application, within the power range of a switched-mode power supply, a threshold for the measured power output is declared, which may be exceeded only for a short time. When this threshold is exceeded for a longer time, a protective circuit is activated, which, for example, switches out the switched-mode power supply. Enhanced safety is achieved in this way, since the cutoff eliminates the risk of fire for a sustained overload. A further advantage derives from the cost savings, since, with respect to the resulting heat dissipation, the switched-mode power supply need not be designed to accommodate a temporary peak power, but rather for a significantly lower continuous power. This in turn permits the use of smaller transformers and smaller cooling plates.

Further advantageous developments are characterized by a circuit arrangement for determining the output power of a switched-mode power supply where the energy storage element is a charge capacitor, where an integration element has an RC element with a resistor and an integration capacitor, and where a constant current source is connected to the charge capacitor and a resistor, and the constant current source is connected to the switch such that, when the switch is closed, the current of the constant current source is discharged to a ground.

BRIEF DESCRIPTION OF THE DRAWINGS

The invention is detailed below with the aid of Figures and of an exemplifying embodiment.

FIGS. 1(a)–(c) are timing diagrams showing voltage and current characteristics in a power measurement process, FIG. 2 is a schematic and timing diagram of an inventive circuit arrangement and FIG. 3 is a timing diagram showing transformer discharging currents at various frequencies.

DESCRIPTION OF THE PREFERRED EMBODIMENTS

Figure 2:
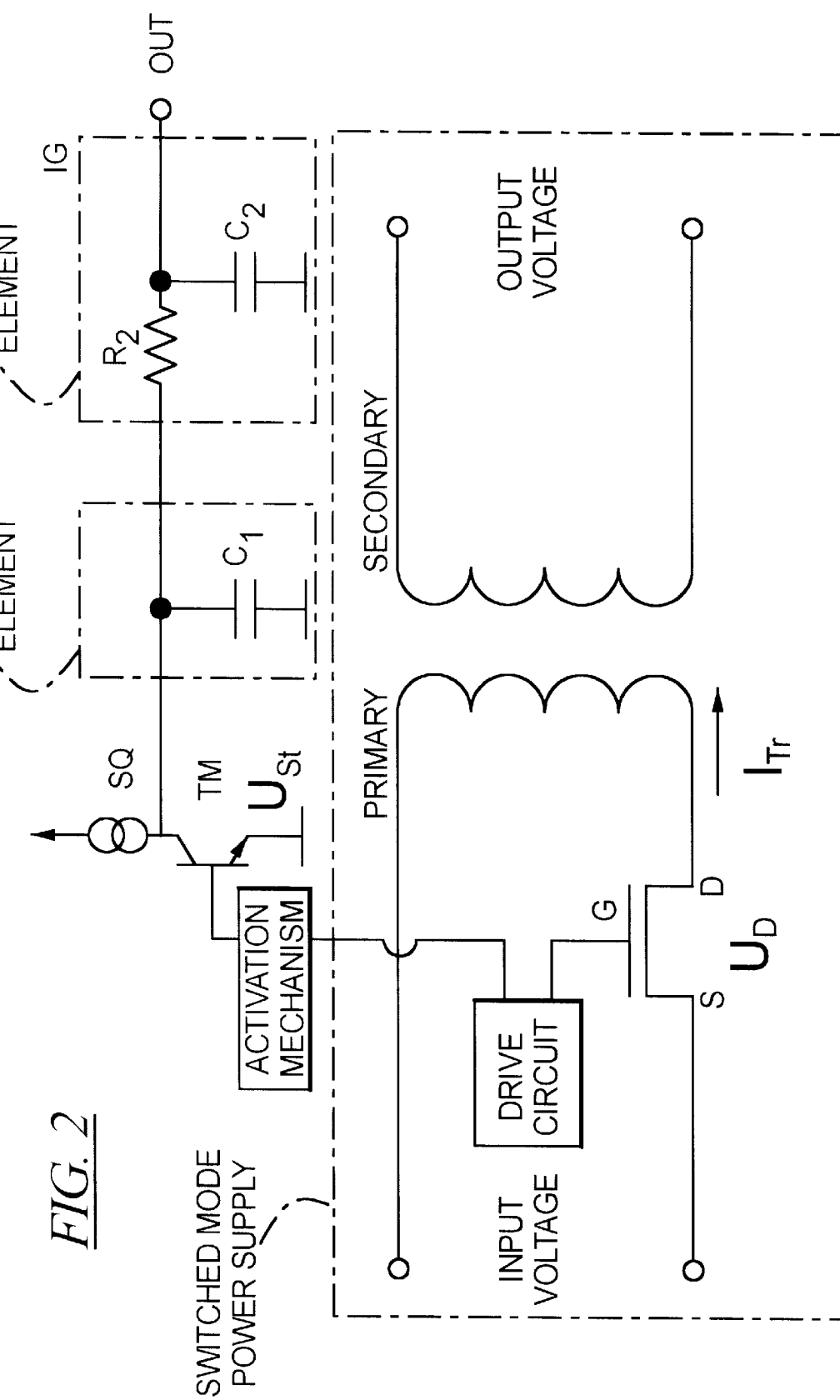

It is generally known that, in a switched-mode power supply, the current flowing through the primary winding of a switched-mode power supply transformer is chopped using a switching transistor. A power MOSFET transistor is generally used as switching transistor. FIG. 1(a) illustrates the drain voltage of such a switching transistor of a switched-mode power supply. During a make time, which runs from time $t_0$ to time $t_1$ and in which the switched-mode power supply transformer is charged, the drain voltage $U_D$ is practically zero volts. Within a discharging time period $t_E$ between the times $t_1$ and $t_2$ the drain voltage can reach several hundred volts. The transformer of the switched-mode power supply is discharged during the discharging time $t_E$. Thus, during a period of the switched-mode power supply, the transformer is charged via the primary side with a specific energy content, which it subsequently delivers to the secondary side.

FIG. 1(b) charts the charging and discharging current of a transformer in a switched-mode power supply. The charging current rises from zero amperes during the make time of the switching transistor up to time $t_1$, at which point the switching transistor is switched out. In the subsequent discharging time $t_E$ the discharging current of the transformer drops to zero amperes again by the time $t_2$. A recharging of the transformer occurs only when the drain voltage of the switching transistor has again dropped to zero V. The pauses between discharging and subsequent charging of the transformer can be different and depend on the power output of the switched-mode power supply.

The electrical work W can generally be computed using:

$$W = \int U(t) \cdot I(t) \, dt \quad (1)$$

The output voltages of switched-mode power supplies are regulated. The magnitudes of the output voltages are always constant and largely independent of the drawn power. The following relation applies here:

$$U(t) = U_{konst} \quad (2)$$

Equation (1) is thus simplified by the following:

$$W = U_{konst} \int I(t) \, dt \quad (3)$$

The electrical power P can be calculated from the work as follows:

$$P = \frac{dW}{dt} \quad (4)$$

Since the discharging current of the switched-mode power supply has a saw-tooth characteristic and comprises pauses, as described above, the power is measured via the energy that is respectively stored in the transformer. Since the charging time of the transformer depends on the system voltage, and this would therefore also have to be taken into account in order to measure the power, it is easier to measure the power during the discharging time $t_E$ of the transformer. During this time the voltage of the transformer is constant; the energy content W of the transformer is the area under the curve for the discharging current $I_{tr}(t)$ during the discharging time $t_E$.

This area is indicated by the hatched area in FIG. 1(b). The energy of the transformer for a complete period of the switched-mode power supply is thus a measure of the power of the switched-mode power supply during this period. By averaging the areas over several periods, one obtains the mean power of the switched-mode power supply during these periods.

The circuit arrangement for measuring power according to FIG. 2 has an energy storage element C1 and an integration element IG. In the exemplifying embodiment, a charge capacitor C1 that is connected between a current source SQ and a reference potential, such as an earth ground, serves as an energy storage element. An RC element, in which a resistor R2 is connected between the current source SQ and an output OUT of the circuit arrangement, is provided for the integration element. An integration capacitor C2 of the RC element is connected between the output OUT and the reference potential. The constant current source SQ is additionally connected to the reference potential via a transistor TM such that, when the control input of the transistor TM is appropriately actuated by an actuation mechanism with the voltage $U_{st}$, the current of the current source SQ is discharged to the reference potential.

The current source SQ is preferably realized as a constant current source, which delivers a constant current I independent of the load connected to it.

The preferred time characteristic of the control voltage $U_{st}$ of the transistor TM is likewise illustrated in FIG. 2. During the discharging time $t_E$, the control voltage $U_{st}$ equals zero, so that the transistor TM blocks. At the time points outside the discharging time period $t_E$, the control voltage $U_{st}$ does not equal zero and is proportioned such that the transistor TM connects through. The discharging time period $t_E$ can be acquired without great effort, for instance, by using a comparator circuit. This period is the time period during a switching cycle in which the drain voltage of the switching transistor of the switched-mode power supply exceeds a specific threshold. During the discharging time period $t_E$, the charging capacitor C1 is charged by the constant current I, so that the voltage $U_{C1}$ at C1 rises in the form of a ramp. At the end of the discharging time period $t_E$ at the time $t_2$, the charge capacitor C1 is rapidly discharged by the transistor TM. The voltage characteristic at the charge capacitor C1 is represented by a solid line in FIG. 1(c). The described charging and discharging process is repeated in each period of the switched-mode power supply.

The voltage $U_{C1}$ at the charge capacitor C1 is integrated by the integration element IG which is connected downstream. The voltage $U_{C2}$ across the integration capacitor C2 corresponds to the output voltage at the output OUT of the circuit arrangement and is proportional to the mean power of the switched-mode power supply. This voltage $U_{C2}$ can be fed directly to a comparator, as described above, in order to activate a particular operational mode, for example.

The RC element consisting of the resistor R2 and the integration capacitor C2 is preferably high-resistance so that the voltage $U_{C1}$ across the charge capacitor C1 is not negated by a current through the resistor R2. The time characteristic of the RC element is determined by the dimensioning of the resistor R2 and of the integration capacitor C2.

During the discharging time $t_E$, the transistor TM is blocked. The current I of the current source SQ charges the charge capacitor C1. The voltage across the charge capacitor C1 is integrated by the integration element IG, so that the voltage of the integration capacitor C2 is proportional to the mean power of the switched-mode power supply. After the discharging time period $t_E$, that is, at time $t_2$, the charge capacitor C1 is discharged via the transistor TM, which is connected through at that time. The following charging process is thus independent of the charge status of the charge capacitor C1 previously achieved.

FIG. 3 illustrates transformer discharging currents $I_{Tr1}$ and $I_{Tr2}$ for equal output power and for two different frequencies $f_1$ and $f_2$. The frequency $f_2$ is four times higher than frequency $f_1$. The area contents of the triangles represent the energy that is respectively stored in the transformer during the discharging time period $t_E$. The stored energy is four times higher at the frequency $f_1$ than at the frequency $f_2$ during a discharging period. The hatched triangles at the frequency $f_1$ are equal in area to one of the triangles at the frequency $f_2$, respectively. Averaged over time over four periods or a multiple of four periods, the same area derives, independent of the frequency. The mean power is thus equal in both cases, though the transformer current $I_{Tr1}$ at the frequency $f_1$ is twice as large as the transformer current $I_{Tr2}$ at the frequency $f_2$. The d.c. voltage at the integration capacitor C2 of the integration element IG is drawn as a dotted line. It indicates the mean power and is equally large for both frequencies. It is clear that the transformer discharging currents are not a measure of the mean power. The inventive circuit arrangement accounts for this fact.

Switched-mode power supplies for monitors are frequently synchronized with their line frequency in order to keep interference injections of the switched-mode power supply onto a screen to a minimum. The frequency range of the line frequency is usually between 30 kHz and 110 kHz, depending on the specified resolution and image repetition frequency of the monitor. Thus, these types of switched-mode power supplies for monitors must be laid out for this frequency range. A power limitation is usually accomplished in these switched-mode power supplies by limiting the primary pulse current through the switching transistor to a maximum value that is dependent on the switching frequency. This maximum value must be smaller for higher switching frequencies than for lower ones if the power that can be drawn from the switched-mode power supply is to remain approximately constant. If the maximum value for the lowest switching frequency is fixed, the power that can be drawn for higher switching frequencies increases relative to that which can be drawn given lower frequencies. This can lead to overheating of components and thus to the risk of fire given failure. A thermal rating of the switched-mode power supply to the maximum possible drawable power requires expensive components of correspondingly large dimension. With the inventive circuit arrangement, in order to achieve a power limitation, power can be measured on the primary side of the switched-mode power supply in a manner that is independent of the frequency.

The above-described circuit apparatus is illustrative of the principles of the present invention. Numerous modifications and adaptions thereof will be readily apparent to those skilled in this art without departing from the spirit and scope of the present invention.

What is claimed is:

1. A circuit arrangement for determining an output power of a switched-mode power supply, comprising:

a field effect transistor;

a transformer having a primary side supplied with energy via said field effect transistor, said transformer delivering said energy to a secondary side of said transformer during a discharging time period;

an integration element;

a constant current source;

an energy storage element being charged with a current by said constant current source during a period in which a drain voltage of said field effect transistor exceeds a specific threshold, and is discharged in a remaining time via said field effect transistor; and said integration element being connected to said energy storage element, said integration element integrating a voltage across said energy storage element and feeds it to an output as a measure of output power of said switched-mode power supply.

2. A circuit arrangement as claimed in claim 1, wherein said energy storage element is a charge capacitor.

3. A circuit arrangement as claimed in claim 1, wherein said integration element has an RC element comprising a resistor and an integration capacitor.

4. A circuit arrangement as claimed in claim 2, wherein said constant current source is connected to said charge capacitor and a resistor, and said constant current source is connected to said switch such that, when said switch is closed, current of said constant current source is discharged to a ground.

* * * * *